United States Patent [19]

Hurtig

[11] Patent Number: 5,392,989
[45] Date of Patent: Feb. 28, 1995

[54] NOZZLE ASSEMBLY FOR DISPENSING LIQUID

[75] Inventor: Roy E. Hurtig, Saratoga, Calif.

[73] Assignee: Semiconductor Systems, Inc., Fremont, Calif.

[21] Appl. No.: 248,566

[22] Filed: May 24, 1994

Related U.S. Application Data

[63] Continuation of Ser. No. 3,708, Jan. 13, 1993, abandoned.

[51] Int. Cl.⁶ .............................................. B05B 15/04
[52] U.S. Cl. ...................... 239/119; 239/499
[58] Field of Search ............... 239/104, 121, 499, 667, 239/169

[56] References Cited

U.S. PATENT DOCUMENTS

| | | | |
|---|---|---|---|
| 2,023,984 | 12/1935 | Wells | 239/602 X |
| 3,315,899 | 4/1967 | Quarve | 239/119 |
| 4,932,593 | 6/1990 | Kiracofe | 239/104 X |

FOREIGN PATENT DOCUMENTS

| | | | |
|---|---|---|---|
| 47806 | 6/1978 | Japan | 239/499 |
| 256379 | 8/1926 | United Kingdom | 239/121 |

*Primary Examiner*—David M. Mitchell
*Assistant Examiner*—Kevin Weldon
*Attorney, Agent, or Firm*—Skjerven, Morrill, MacPherson, Franklin & Friel; David E. Steuber

[57] ABSTRACT

An improved nozzle assembly for dispensing liquid is disclosed. In a first embodiment of the invention, the liquid dispenser comprises a nozzle assembly with an expansive cavity at its dispensing end. When the flow of liquid in the dispenser is halted, a pocket of liquid formed inside the cavity ties the liquid in the nozzle to the liquid in a drop formed at the tip of the nozzle. Thus, when "suck-back" is applied, the drop is pulled into the cavity and up the nozzle, leaving at most a very small and stable amount of liquid inside the cavity. In a second embodiment of the invention, an inner nozzle tube extends beyond the end of an outer nozzle tube, creating an external annular recess which captures and holds a drop of liquid over the end of the nozzle. After suck-back, the drop is pulled up into the nozzle, leaving a small, stable amount of liquid in the annular recess.

9 Claims, 3 Drawing Sheets

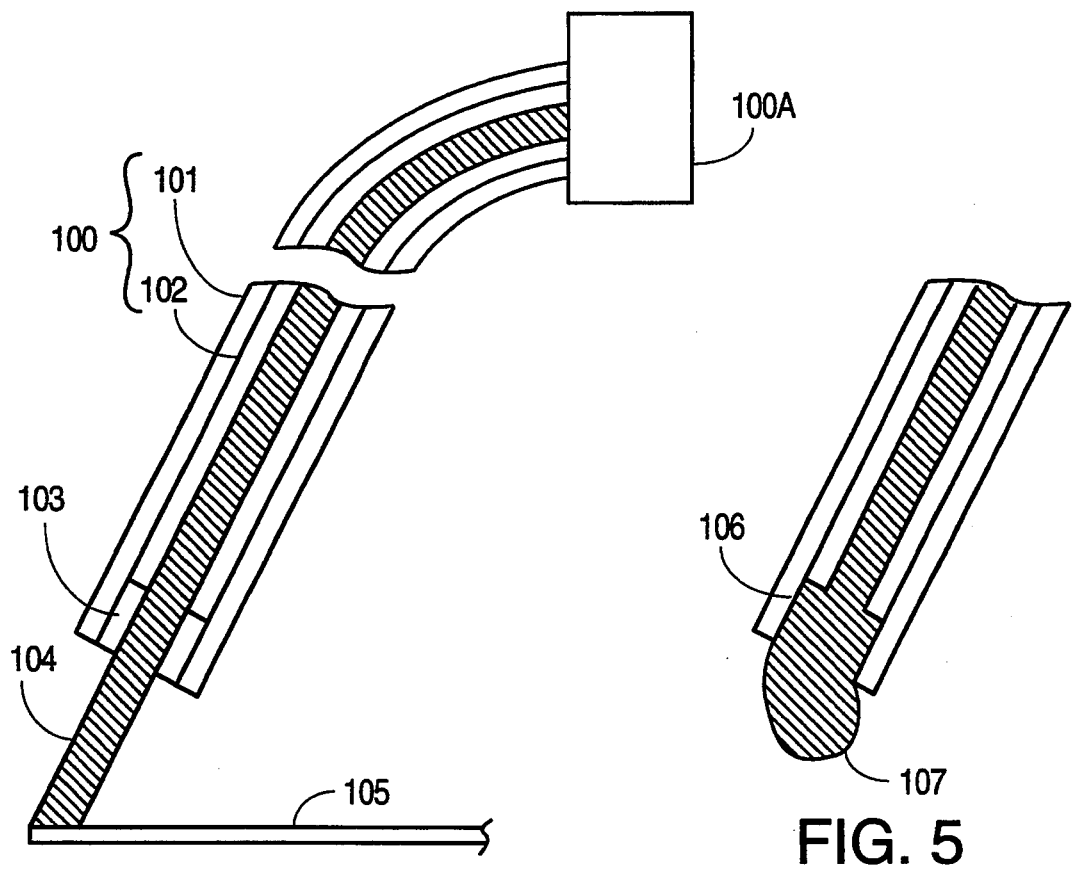
FIG. 4
FIG. 5
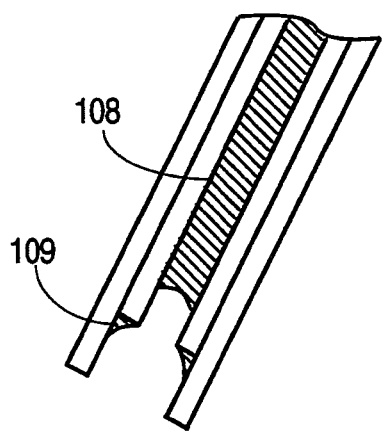
FIG. 6

NOZZLE ASSEMBLY FOR DISPENSING LIQUID

This application is a continuation of application Ser. No. 08/003,708, filed Jan. 13, 1993, now abandoned.

FIELD OF THE INVENTION

This invention relates to a nozzle for the dispensing liquid while providing a clean interruption in the flow thereof; in particular, for the dispensing of solvent onto a photoresist coating on a semiconductor substrate.

BACKGROUND OF THE INVENTION

The coating of semiconductor wafers is done in a spin coating machine by covering the top surface of a wafer with liquid photoresist while the wafer is spun slowly, then shutting off the supply of photoresist and spinning the wafer at high speed to remove the excess photoresist, thereby achieving a thinner, more uniform, coating. This coating can be applied through a nozzle supported by a fixed or moveable arm.

At the end of this process, a rim or "bead" of photoresist remains on the edge of the wafer. It is desirable to remove this bead, as it is thought to be a source of loose particles, as a result of handling the wafers during processing, which may produce irregularities and defects in the semiconductor components on the wafer. Currently, as described in U.S. Pat. No. 4,518,678, this bead is removed by slowly spinning the wafer and applying solvent to the bottom of the wafer, from a solvent nozzle located under the wafer, thus causing some of the solvent to "wick" around the edge and wash off the photoresist bead on the top outside edge of the wafer. The solvent used is typically a special solvent for top edge removal.

The main disadvantage of this procedure is that the flow of solvent over the top of the wafer is uncontrolled, with the potential to damage some semiconductor devices thereupon as well. Using a top solvent nozzle 1 to apply a stream of solvent 2 to the top of a wafer 3, as shown in FIG. 1, in conjunction with the bottom solvent nozzle, can control the amount of solvent moving towards the inside of the wafer. However, this solution introduces its own inherent problem since the top solvent stream is applied tangentially to the wafer at an angle of about 45° to 50°, and the top nozzle is therefore positioned over the wafer. When the solvent stream is shut off, there is a high probability that a drop 4 of solvent will remain hanging from the edge of the top nozzle, as shown in FIG. 2a, or a drop may free fall onto the wafer, as shown in FIG. 2b. This problem can only be partly overcome by the application of a slight negative pressure to the liquid in the solvent nozzle. This process, called "suck-back", is illustrated in FIG. 3, which shows that a drop 6 may remain at the nozzle's end. This drop may later fall onto the wafer after the process has been completed. This represents an unacceptable risk.

SUMMARY OF THE INVENTION

It is an object of the invention to eliminate or contain the free falling liquid drop. Ordinarily, when suck-back is applied, the path of least resistance is to the outside air, not to the drop that forms at the nozzle tip. Thus, only a small part of the drop is pulled up, leaving the rest of the drop hanging from the nozzle tip.

In one embodiment of the invention, an improved liquid dispenser comprises a nozzle assembly with an expansive cavity at its dispensing end. The pocket of liquid formed inside the end of the cavity ties the liquid in the nozzle to the liquid in the drop. Thus, when suck-back is applied, the drop is pulled into the cavity and up the nozzle, leaving at most a very small and stable amount of liquid inside the cavity.

In a second embodiment of the invention, which may be advantageous in some situations, the liquid dispenser comprises an external recess or groove at the tip of the nozzle. This recess may be formed by means of an extended inner nozzle tube. The annular recess creates, by liquid surface tension, an annular ring of liquid which extends around the sides and over the end of the nozzle. This eliminates the free falling drop at shut off and captures and holds the drop over the end of the nozzle and ties the liquid inside the nozzle to the liquid in the drop. Thus when suck-back is applied, the drop is pulled up into the nozzle, leaving at most a very small and stable amount of liquid in the annular recess on the outside of the nozzle.

BRIEF DESCRIPTION OF THE DRAWINGS

All of the following drawings are cross-sectional views of a nozzle assembly.

FIG. 4 illustrates a nozzle in accordance with a first embodiment of the invention.

FIG. 5 illustrates the pocket of liquid, in the expansive cavity, and the drop which forms when the stream of liquid is interrupted.

FIG. 6 illustrates the column of liquid after suckback.

DESCRIPTION OF THE INVENTION

Figure 1:
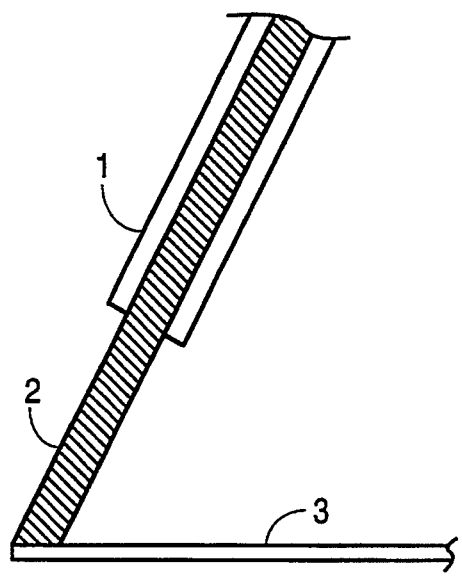
FIG. 1 illustrates a prior art nozzle assembly in the process of dispensing a liquid onto a surface.
Figure 2A:
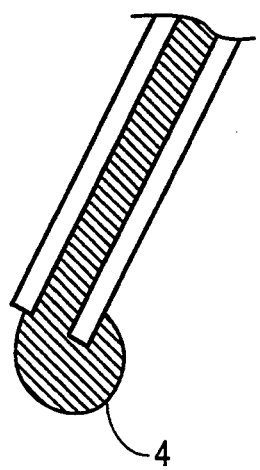
FIG. 2a illustrates the drop of liquid that normally collects on the nozzle assembly when the flow of liquid is interrupted.
Figure 3:
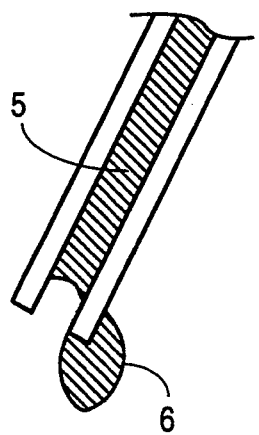
FIG. 3 illustrates a column of liquid receding up the nozzle assembly, separating from the drop of liquid to produce an isolated drop.
Figure 2B:
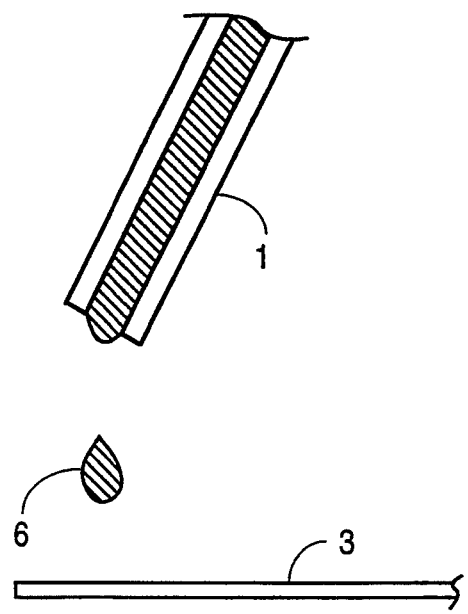
FIG. 2b illustrates the drop of liquid free falling when the liquid in the nozzle is shut off.

In the first embodiment shown in FIG. 4, a nozzle assembly 100 for a liquid dispenser comprises an outer cover tube 101 and an inner nozzle tube 102. The outer cover tube 101 jackets and extends somewhat past the inner nozzle tube 102 to form an expansive cavity 103. By means of a dispensing regulator 100A which causes a liquid stream 104 to flow, liquid stream 104 emerges from the inner nozzle tube 102 onto a surface 105, not normally impinging on the outer cover tube 101. It has been found that a plastic outer cover tube 101, having an inside diameter of 1.57 millimeters and extending 0.1 to 2.0 millimeters past the end of the inner nozzle tube 102 works effectively. For use with current top edge bead removal solvents, the nozzle assembly 100 may be situated above the surface 105 within a wide range around 10 millimeters, and may be angled thereto at 45°–50° degrees.

With reference to FIG. 5, when the dispensing regulator (not shown) interrupts the liquid stream 104, a pocket of liquid 106 will form in the expansive cavity 103 in contact with the outer cover tube 101, with a drop of liquid 107 possibly protruding.

As shown in FIG. 6, negative pressure exerted by the dispensing regulator (not shown) will suck-back the pocket of liquid 106, to leave a receded liquid column 108 and at most a small, stable amount of liquid 109 inside the expansive cavity 103.

While in the embodiment illustrated in FIGS. 4–6, expansive cavity 103 is shown as essentially cylindrical in shape and is formed by the juxtaposition of tubes 101 and 102, it will be apparent to those skilled in the art that the expansive cavity need not be cylindrical and may be formed in many different ways, such as by boring into the tip of the nozzle a hole having a diameter greater that of the flow channel of the nozzle.

Figure 7:
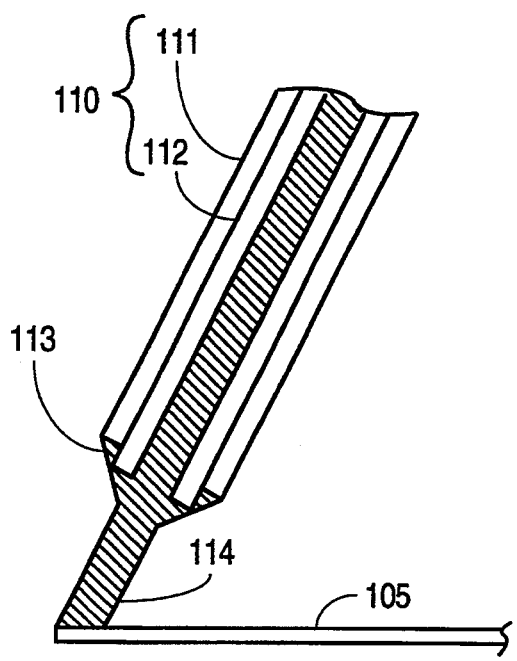
FIG. 7 illustrates a nozzle in accordance with a second embodiment of the invention.
Figure 8:
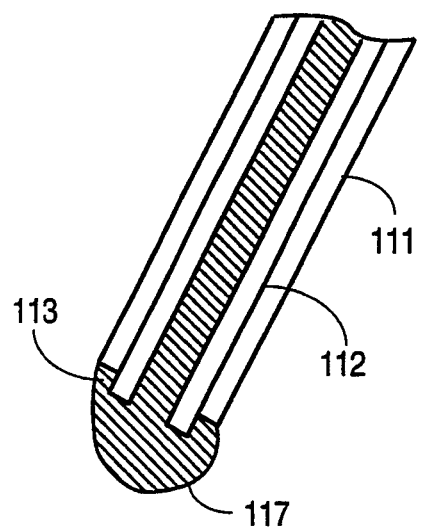
FIG. 8 illustrates the liquid in the second embodiment after the flow has been interrupted.
Figure 9:
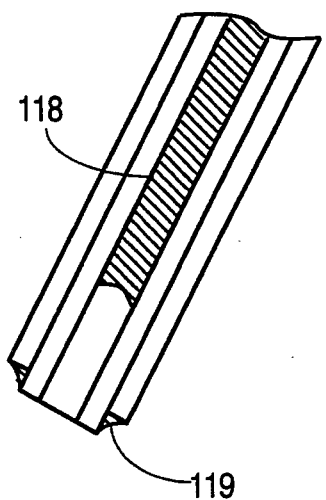
FIG. 9 illustrates the annular ring and the column of liquid after suck-back.

FIGS. 7–9 illustrate a second embodiment of the invention, which may be advantageous in some situations. A nozzle assembly 110 for a liquid dispenser includes an outer cover tube 111 and an inner nozzle tube 112. Inner nozzle tube 112 extends beyond outer nozzle tube 111 so as to form an external annular recess 113. Annular recess 113 is bounded in part by an outward facing wall, the outside surface of tube 112.

FIG. 7 shows a liquid stream 114 flowing through nozzle assembly 110 onto surface 105. FIG. 8 illustrates a liquid drop 117 which forms when a dispensing regulator (not shown) interrupts the liquid stream 114. The liquid in annular recess 113 is in contact with both outer cover tube 111 and inner nozzle tube 112, holding drop 117 onto the nozzle. FIG. 9 shows the situation after suck-back, with the liquid stream 114 drawn back into the nozzle, and an annular ring 119 of the liquid remaining in annular recess 113. The annular ring 119 is found to be highly stable.

Outer cover tube 111 may have an inside diameter of 1.57 millimeters, for example, and inner nozzle tube 112 may extend from 0.05 to 0.50 millimeters past the end of outer cover tube 111.

While in the embodiment illustrated in FIGS. 7–9, annular recess 113 is shown as bounded by two surfaces (the bottom edge of tube 111 and the outside of tube 112) which intersect at a right-angled corner, it will be apparent to those skilled in the art that the shape of recess 113 in cross section may take various other forms. Moreover, the recess need not be formed by the juxtaposition of two tubes, as shown in FIGS. 7–9, but may be formed in various other ways.

Although this invention has been described in the context of dispensing solvent to photoresist on semiconductor wafers, it is clear that this invention has a wide range of applications for dispensing any type of liquid. While the invention has been described with respect to two specific embodiments, minor modifications to the invention which do not depart from the spirit of the invention are deemed to be within the scope of the invention which is to be limited only by the appended claims. It should be clear to those skilled in the art that the expansive cavity and the annular recess disclosed above may assume a variety of shapes and sizes and still perform their claimed functions. Similarly, the nozzle and flow channel are normally circular when viewed at a cross section perpendicular to their axes, but other shapes may also be used.

I claim:

1. A spin coating machine for applying photoresist to a semiconductor wafer, said machine comprising a nozzle assembly for dispensing a stream of solvent and a semiconductor wafer, said nozzle assembly having an expansive cavity at a dispensing end thereof, said nozzle assembly being located over said semiconductor wafer and being positioned such that said stream of solvent is oriented at an oblique angle to a top surface of said wafer, said expansive cavity being adapted to prevent a drop of said solvent from falling from said nozzle assembly onto said semiconductor wafer following an interruption of flow of said stream of solvent through said nozzle assembly.

2. The spin coating machine of claim 1 further comprising a dispensing regulator in flow communication with said nozzle assembly for the application of positive or negative pressure to said solvent.

3. The spin coating machine of claim 1 wherein said nozzle assembly comprises:
    an inner nozzle tube; and
    an outer cover tube, said inner nozzle tube being jacketed by said outer cover tube, said outer tube extending beyond a tip of said inner nozzle tube so as to form said expansive cavity.

4. The spin coating machine of claim 3 wherein said outer cover tube has an inside diameter of about 1.57 millimeters, and said outer cover tube extends past said tip of said inner nozzle tube by 0.1 to 2.0 millimeters.

5. A method dispensing liquid, said method comprising the steps of:
    providing a nozzle assembly, said nozzle assembly having a flow channel and an expansive cavity at an end of said flow channel;
    orienting said flow channel at an angle oblique to horizontal;
    propelling said liquid through said nozzle assembly by the application of positive pressure to said liquid so as to cause said liquid to flow through said flow channel and said expansive cavity of said nozzle assembly, said liquid passing from said expansive cavity immediately into a region beneath said nozzle assembly;
    interrupting the flow of said liquid so as to form a terminal pocket of liquid in said expansive cavity; and
    withdrawing said terminal pocket of liquid by applying a negative pressure to said liquid, thereby preventing said terminal pocket of liquid from falling from said nozzle assembly.

6. A spin coating machine for applying photoresist to a semiconductor wafer, said machine comprising a nozzle assembly for dispensing a stream of solvent and a semiconductor wafer, said nozzle assembly having an internal channel for said stream of said solvent, said nozzle assembly further having an external annular recess formed at an end of said channel, said annular recess surrounding said channel, said nozzle assembly being located over said semiconductor wafer and being positioned such that said stream of solvent is oriented at an oblique angle to a top surface of said wafer, said annular recess being adapted to prevent a drop of said solvent from falling from said nozzle assembly onto said semiconductor Wafer following an interruption of flow of said stream of solvent through said nozzle assembly.

7. The spin coating machine of claim 6 further comprising a dispensing regulator for the application of positive or negative pressure to said solvent.

8. The spin coating machine of claim 6 wherein said nozzle assembly comprises:
    an inner nozzle tube; and an outer cover tube, said inner nozzle tube being jacketed by said outer cover tube, said inner nozzle tube extending beyond an end of said outer cover tube so as to form said external annular recess.

9. The spin coating machine of claim 8 wherein said outer cover tube has an inside diameter of about 1.57 millimeters, and said inner nozzle tube extends past said end of outer cover tube by 0.05 to 0.5 millimeters.

* * * * *